United States Patent
Wang et al.

(10) Patent No.: US 9,263,995 B2
(45) Date of Patent: Feb. 16, 2016

(54) MULTI-MODE OPAMP-BASED CIRCUIT

(71) Applicant: MediaTek Inc., Hsin-Chu (TW)

(72) Inventors: Chi Yun Wang, Tainan (TW);
Chih-Hong Lou, Jiaosi Township, Yilan County (TW)

(73) Assignee: MEDIATEK INC., Hsin-Chu (TW)

( * ) Notice: Subject to any disclaimer, the term of this patent is extended or adjusted under 35 U.S.C. 154(b) by 49 days.

(21) Appl. No.: 14/073,148

(22) Filed: Nov. 6, 2013

(65) Prior Publication Data

US 2014/0132341 A1    May 15, 2014

Related U.S. Application Data (60) Provisional application No. 61/726,277, filed on Nov. 14, 2012.

(51) Int. Cl.
| | |
|---|---|
| H03F 1/14 | (2006.01) |
| H03F 1/34 | (2006.01) |
| H03F 1/48 | (2006.01) |
| H03F 3/45 | (2006.01) |

(52) U.S. Cl.
CPC .. *H03F 1/34* (2013.01); *H03F 1/14* (2013.01); *H03F 1/486* (2013.01); *H03F 3/45475* (2013.01); *H03F 3/45941* (2013.01); *H03F 3/45946* (2013.01); *H03F 2203/45138* (2013.01); *H03F 2203/45512* (2013.01); *H03F 2203/45514* (2013.01); *H03F 2203/45576* (2013.01); *H03F 2203/45644* (2013.01)

(58) Field of Classification Search
CPC ........................................................ H03F 1/14
USPC .................................. 330/292, 260, 293, 294
See application file for complete search history.

(56) References Cited

U.S. PATENT DOCUMENTS

| | | | | |
|---|---|---|---|---|
| 5,877,612 | A * | 3/1999 | Straw | 330/254 |
| 7,589,587 | B2 * | 9/2009 | Yoshida et al. | 330/9 |
| 7,679,422 | B1 * | 3/2010 | Thiagarajan et al. | 327/337 |
| 8,456,231 | B2 * | 6/2013 | Yamazaki | 327/554 |
| 8,497,746 | B2 * | 7/2013 | Visconti et al. | 333/173 |

* cited by examiner

*Primary Examiner* — Henry Choe
(74) *Attorney, Agent, or Firm* — McClure, Qualey & Rodack, LLP (57) ABSTRACT

A multi-mode OPAMP-based circuit is provided. An input amplifying stage amplifies a pair of input differential signals to provide a pair of intermediate differential signals. An output amplifying stage amplifies the pair of intermediate differential signals to provide a pair of output differential signals. A first capacitor is disposed in a first negative feedback loop of the output amplifying stage. A second capacitor is disposed in a second negative feedback loop of the output amplifying stage. A third capacitor is selectively disposed in a first positive feedback loop of the output amplifying stage or coupled to the first capacitor in parallel according to a control signal. A fourth capacitor is selectively disposed in a second positive feedback loop of the output amplifying stage or coupled to the second capacitor in parallel according to the control signal.

24 Claims, 9 Drawing Sheets

MULTI-MODE OPAMP-BASED CIRCUIT

CROSS REFERENCE TO RELATED APPLICATIONS

This Application claims priority of U.S. Provisional Application No. 61/726,277, filed on Nov. 14, 2012, the entirety of which is incorporated by reference herein.

BACKGROUND OF THE INVENTION

1. Field of the Invention

The invention relates to an operational amplifier (OPAMP), and more particularly, to an operational amplifier of a multi-mode OPAMP-based circuit.

2. Description of the Related Art

Operational amplifiers (OPAMPs) have been applied extensively in the field of electrical devices and electronics, such as inverting amplifiers, integrators, and filter circuits, to name just a few instances. With the rapid scaling in CMOS processes, supply voltages in VLSL have been dramatically reduced in recent years. Acting as a fundamental block in most analog systems, operational amplifiers are required to achieve high gain and large bandwidth simultaneously in low-voltage applications. Since conventional cascode amplifiers, which increase the gain by stacking up transistors, are not suitable in low-voltage designs due to small voltage swings, more circuit designers are aware of the importance of multi-stage amplifiers, which boost the gain by increasing the number of gain stages horizontally. However, all multi-stage amplifiers suffer close-loop stability problems due to their multiple-pole nature in the small-signal transfer functions. Therefore, many frequency compensation topologies have been proposed to ensure the stability of the multi-stage amplifiers. Generally, the operational amplifier applied in the conventional driver chip is normally a two-stage amplifier having a first-stage amplifying circuit for gain enhancement and a second-stage output circuit for driving the capacitive or resistive load. However, multi-stage operational amplifiers are also gaining in popularity.

The most relevant characteristics of an amplifier circuit are usually gain and bandwidth. There is an inverse relationship between the gain and the bandwidth of amplifiers. In general, higher gain values are associated with lower bandwidths, and lower gain values are associated with higher bandwidths. Various compensation techniques, such as Miller compensation or Ahuja compensation, are known for adjusting the frequency of the poles of the amplifier. Miller compensation employs a feedback capacitor connected across an input and output of the second amplifier stage. In Ahuja compensation, a current gain device is added in the feedback loop of the second amplifier stage.

BRIEF SUMMARY OF THE INVENTION

Multi-mode OPAMP-based circuits are provided. An embodiment of a multi-mode OPAMP-based circuit is provided. The multi-mode OPAMP-based circuit comprises an operational amplifier. The operational amplifier comprises: an input amplifying stage, amplifying a pair of input differential signals to provide a pair of intermediate differential signals; an output amplifying stage, amplifying the pair of intermediate differential signals to provide a pair of output differential signals; and a compensation unit. The compensation unit comprises: a first capacitor disposed in a first negative feedback loop of the output amplifying stage; a second capacitor disposed in a second negative feedback loop of the output amplifying stage; a third capacitor selectively disposed in a first positive feedback loop of the output amplifying stage or coupled to the first capacitor in parallel according to a control signal; and a fourth capacitor selectively disposed in a second positive feedback loop of the output amplifying stage or coupled to the second capacitor in parallel according to the control signal.

Furthermore, another embodiment of a multi-mode OPAMP-based circuit is provided. The multi-mode OPAMP-based circuit comprises an operational amplifier. The operational amplifier comprises: an input amplifying stage, amplifying a pair of input differential signals to provide a pair of intermediate differential signals; an output amplifying stage, amplifying the pair of intermediate differential signals to provide a pair of output differential signals; and a compensation unit. The compensation unit comprises: a first programmable capacitor unit coupled to a non-inverting input terminal of the output amplifying stage; and a second programmable capacitor unit coupled to an inverting input terminal of the output amplifying stage. Each of the first and second programmable capacitor units provides a fixed capacitance in a common mode for the operational amplifier, and each of the first and second programmable capacitor units provides adjustable capacitance in a differential-mode according to a control signal for the operational amplifier.

Moreover, another embodiment of a multi-mode OPAMP-based circuit is provided. The multi-mode OPAMP-based circuit comprises an operational amplifier. The operational amplifier comprises: an input amplifying stage, amplifying a pair of input differential signals to provide a pair of intermediate differential signals; an output amplifying stage, amplifying the pair of intermediate differential signals to provide a pair of output differential signals; and a compensation unit. The compensation unit comprises: a first programmable capacitor unit coupled to a non-inverting input terminal of the output amplifying stage; and a second programmable capacitor unit coupled to an inverting input terminal of the output amplifying stage. Each of the first and second programmable capacitor units provides adjustable capacitance in a differential-mode according to a control signal for the operational amplifier, so that a dominant pole frequency of an open-loop gain of the operational amplifier is increased when the open-loop gain of the operational amplifier is decreased.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
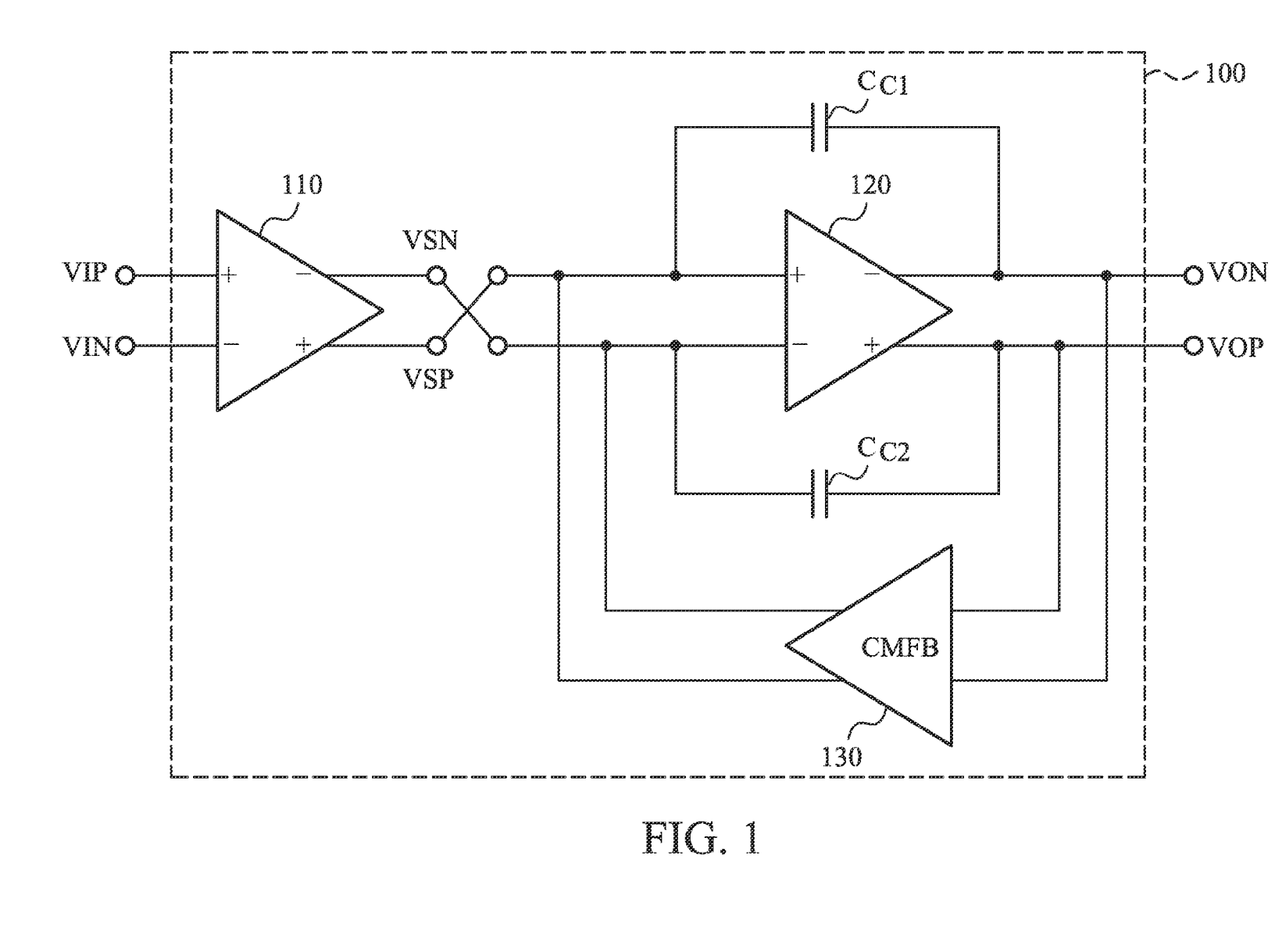
FIG. 1 shows a two-stage operational amplifier (OPAMP)

FIG. 1 shows a two-stage operational amplifier (OPAMP) 100. The two-stage operation amplifier 100 comprises two amplifying stages 110 and 120 and a common mode feedback stage (CMFB) 130. The amplifying stage 110 has a non-inverting input terminal for receiving an input signal VIP and an inverting input terminal for receiving an input signal VIN, wherein the input signals VIP and VIN are a pair of differential signals. The amplifying stage 110 amplifies the pair of differential signals VIP and VIN, to provide a pair of differential signals VSP and VSN to the amplifying stage 120. As shown in FIG. 1, an inverting output terminal and a non-inverting output terminal of the amplifying stage 110 are coupled to an inverting input terminal and a non-inverting input terminal of the amplifying stage 120, respectively. The amplifying stage 120 amplifies the pair of differential signals VSP and VSN to output a pair of differential signals VOP and VON. The common mode feedback stage 130 is coupled to the amplifying stage 120 in parallel, wherein the inverting output terminal and the non-inverting output terminal of the amplifying stage 120 are respectively coupled to a first input terminal and a second input terminal of the common mode feedback stage 130, and a first output terminal and a second output terminal of the common mode feedback stage 130 are respectively coupled to the inverting input terminal and the non-inverting input terminal of the amplifying stage 120. Furthermore, the operation amplifier 100 further comprises the compensation capacitors $C_{C1}$ and $C_{C2}$, so as to split poles for stability of the differential-mode loop and the common mode loop. The compensation capacitor $C_{C1}$ is disposed in a negative feedback loop for the non-inverting input terminal of the amplifying stage 120, and the compensation capacitor $C_{C2}$ is disposed in a negative feedback loop for the inverting input terminal of the amplifying stage 120.

Figure 2:
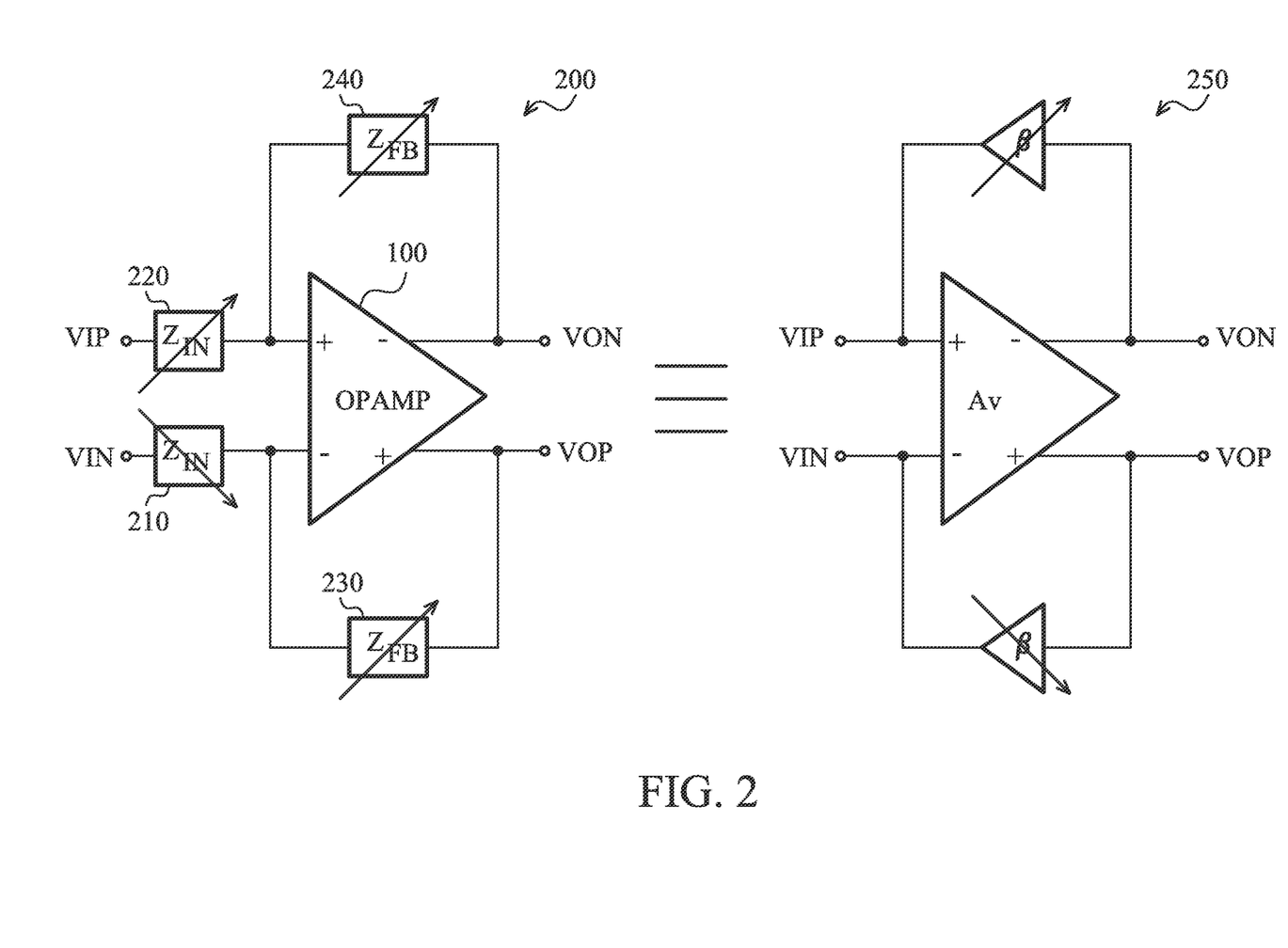
FIG. 2 shows a multi-mode OPAMP-based circuit.

FIG. 2 shows a multi-mode OPAMP-based circuit 200. The multi-mode OPAMP-based circuit 200 may be a programmable-gain amplifier (PGA), a filter, or a delta-sigma analog-to-digital converter (ΔΣ ADC). The multi-mode OPAMP-based circuit 200 comprises a multi-stage operational amplifier 100, two input impedances 210 and 220, and two feedback impedances 230 and 240, wherein the input impedances 210 and 220 are identical, and the feedback impedances 230 and 240 are identical. Furthermore, the impedances 210, 220, 230 and 240 are variable. In an equivalent differential-mode model 250 for the multi-mode OPAMP-based circuit 200, Av represents a voltage gain of the multi-stage operational amplifier 100, and a feedback gain β is obtained according to the following equation:

$$\beta = \frac{Z_{IN}}{Z_{FB} + Z_{IN}},$$

where $Z_{IN}$ represents the input impedance 210 or 220, and $Z_{FB}$ represents the feedback impedance 230 or 240. Furthermore, the impedances 210, 220, 230 and 240 can be implemented by the resistors or other impedance devices.

Figure 3:
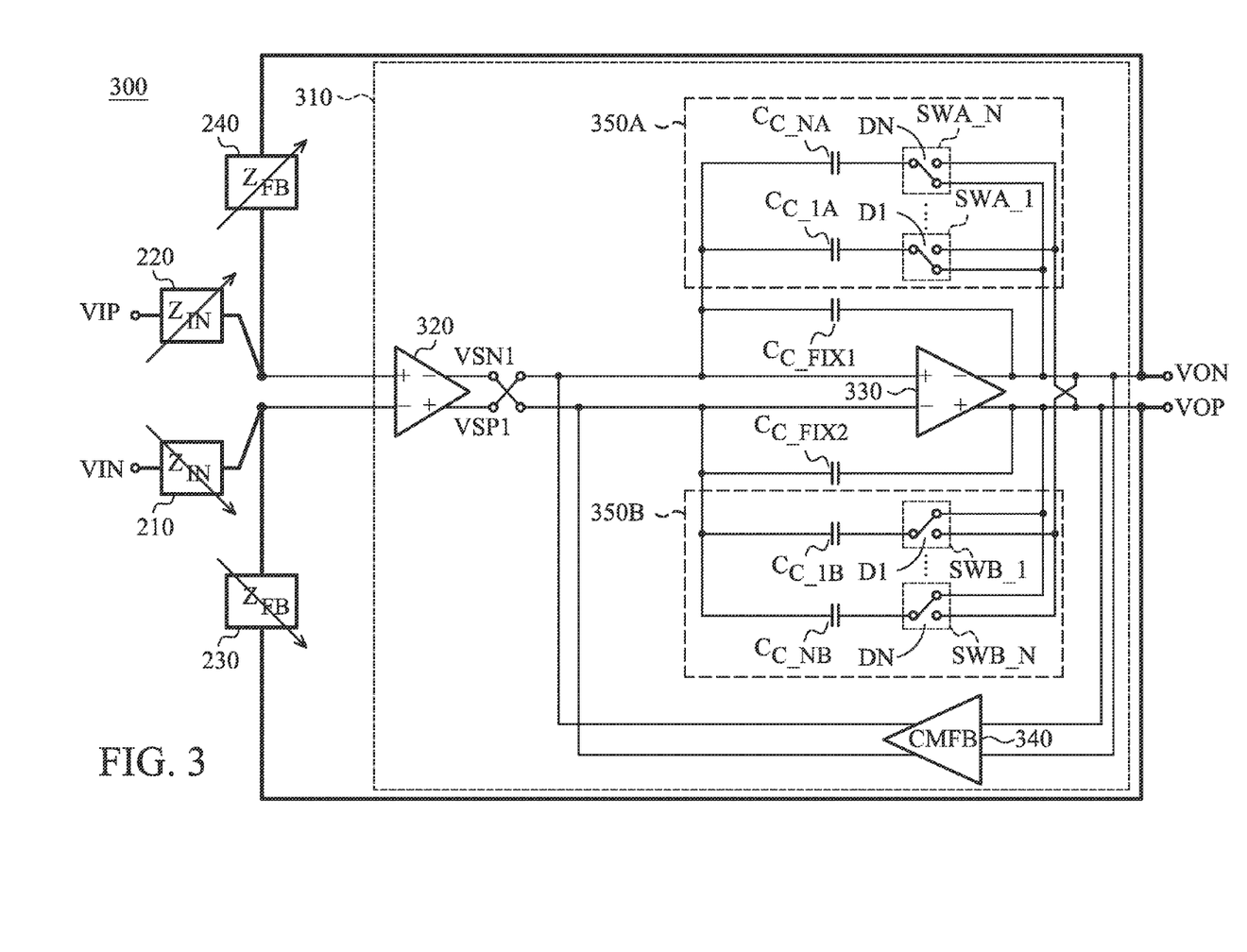
FIG. 3 shows a multi-mode OPAMP-based circuit according to an embodiment of the invention.
Figure 4:
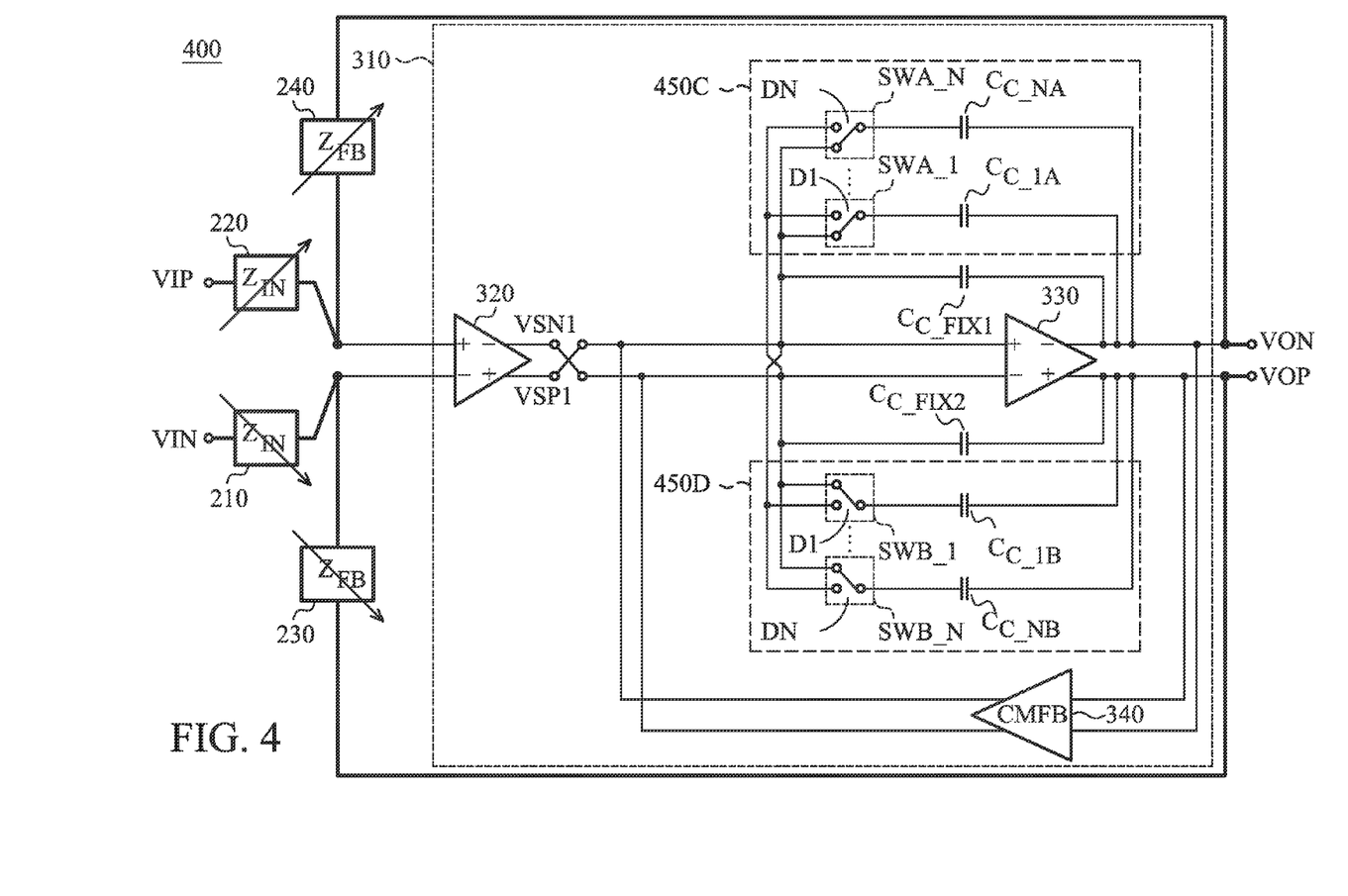
FIG. 4 shows a multi-mode OPAMP-based circuit according to another embodiment of the invention.

FIG. 3 shows a multi-mode OPAMP-based circuit 300 according to an embodiment of the invention. The multi-mode OPAMP-based circuit 300 comprises a two-stage operational amplifier 310, two input impedances 210 and 220, and two feedback impedances 230 and 240. The two-stage operational amplifier 310 comprises an input amplifying stage 320, an output amplifying stage 330 and a common mode feedback stage 340. Compared to the two-stage operational amplifier 100 of FIG. 1, the two-stage operational amplifier 310 further comprises two compensation units 350A and 350B. The compensation unit 350A is coupled to the non-inverting input terminal of the output amplifying stage 330, and the compensation unit 350B is coupled to the inverting input terminal of the output amplifying stage 330. The compensation unit 350A comprises a plurality of capacitors $C_{C\_1A}$-$C_{C\_NA}$ and a plurality of selectors SWA_1-SWA_N, and the compensation unit 350B comprises a plurality of capacitors $C_{C\_1B}$-$C_{C\_NB}$ and a plurality of selectors SWB_1-SWB_N. The selectors SWA_1 and SWB_1 are controlled by a control signal D1, the selectors SWA_2 and SWB_2 are controlled by a control signal D2, and so on. Taking the selector SWA_N as an example, when the control signal DN is "1", the capacitor $C_{C\_NA}$ is coupled to the inverting output terminal of the output amplifying stage 330, i.e. the capacitor $C_{C\_NA}$ is coupled to the capacitor $C_{C\_FIX1}$ in parallel. Conversely, when the control signal DN is "0", the capacitor $C_{C\_NA}$ is coupled to the non-inverting output terminal of the output amplifying stage 330, i.e. the capacitor $C_{C\_NA}$ is disposed in a positive feedback loop of the output amplifying stage 330. In FIG. 3, the selectors SWA_1-SWA_N are respectively coupled between the corresponding capacitors $C_{C\_1A}$-$C_{C\_NA}$ and the output terminals of the output amplifying stage 330, and the selectors SWB_1-SWB_N are respectively coupled between the corresponding capacitors $C_{C\_1B}$-$C_{C\_NB}$ and the output terminals of the output amplifying stage 330. In one embodiment, the selectors SWA_1-SWA_N are respectively coupled between the capacitors $C_{C\_1A}$-$C_{C\_NA}$ and the input terminals of the output amplifying stage 330, and the selectors SWB_1-SWB_N are respectively coupled between the capacitors $C_{C\_1B}$-$C_{C\_NB}$ and the input terminals of the output amplifying stage 330, as shown in FIG. 4. FIG. 4 shows a multi-mode OPAMP-based circuit 400 according to another embodiment of the invention. In FIG. 4, taking the selector SWC_1 of the compensation unit 450C as an example, when the control signal D1 is "1", the capacitor $C_{C\_1A}$ is coupled to the non-inverting input terminal of the output amplifying stage 330, i.e. the capacitor $C_{C\_1A}$ is coupled to the capacitor $C_{C\_FIX1}$ in parallel. Conversely, when the control signal D1 is "0", the capacitor $C_{C\_1A}$ is coupled to the inverting input terminal of the output amplifying stage 330, i.e. the capacitor $C_{C\_1A}$ is disposed in a positive feedback loop of the output amplifying stage 330.

Figure 5A:
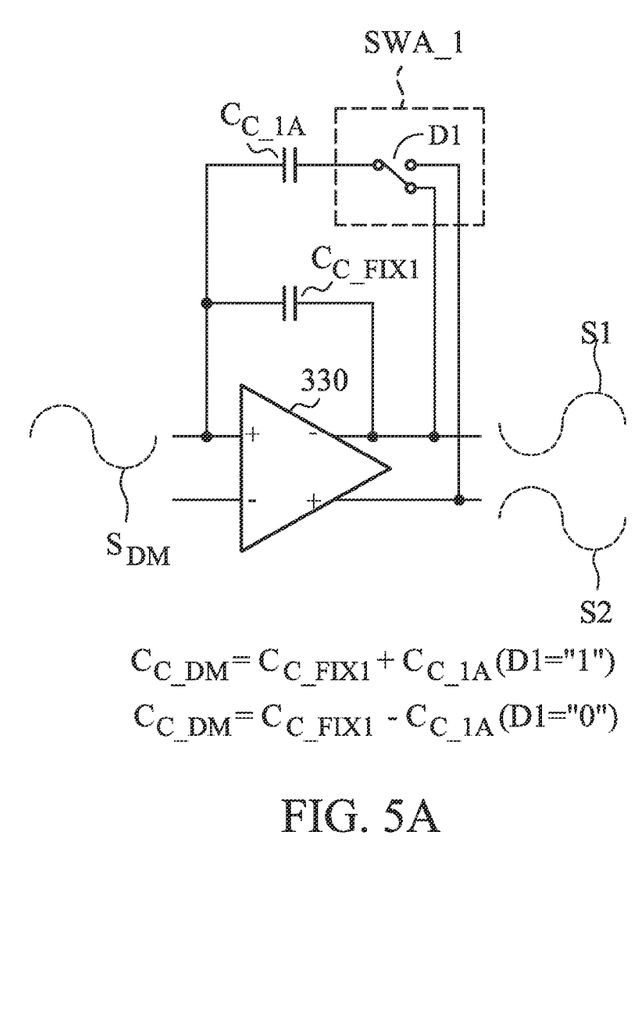
FIG. 5A shows an analysis schematic illustrating a differential mode (DM) for the output amplifying stage of FIG. 3.

FIG. 5A shows an analysis schematic illustrating a differential mode (DM) for the output amplifying stage 330 of FIG. 3. In order to simplify the description, only the selector SWA_1 and the capacitor $C_{C\_1A}$ are described for the compensation unit 350A. In response to a differential-mode signal $S_{DM}$ at the non-inverting input terminal of the amplifying stage 330, the amplifying stage 330 provides a signal S1 at the inverting output terminal thereof when the control signal D1 is "1", wherein the signal S1 and the differential-mode signal $S_{DM}$ have the opposite phases. Thus, an effective differential-mode capacitance $C_{C\_DM}$ is obtained for the compensation unit 350A and the capacitor $C_{C\_FIX1}$, and the capacitor $C_{C\_DM}$ is equal to the sum of the capacitors $C_{C\_FIX1}$ and $C_{C\_1A}$, i.e. $C_{C\_DM}=C_{C\_FIX1}+C_{C\_1A}$ (D1="1"). Furthermore, when the control signal D1 is "0", the amplifying stage 330 provides a signal S2 at the non-inverting output terminal thereof when the control signal D1 is "0", wherein the signal S2 and the differential-mode signal $S_{DM}$ have the same phases. Thus, an effective differential-mode capacitance $C_{C\_DM}$ is obtained for the compensation unit 350A and the capacitor $C_{C\_FIX1}$, and the capacitor $C_{C\_DM}$ is equal to the difference between the capacitors $C_{C\_FIX1}$ and $C_{C\_1A}$, i.e. $C_{C\_DM}=C_{C\_FIX1}-C_{C\_1A}$ (D1="0"). Therefore, the effective differential-mode capacitance $C_{C\_DM}$ is programmable and can be delicately optimized for different feedback gain β ratios (e.g. different operation modes). Furthermore, for the N selectors SWA_1-SWA_N, an effective differential-mode capacitance $C_{C\_DM}$ is obtained for the compensation unit 350A and the capacitor $C_{C\_FIX1}$ according to the following equation:

$$C_{C\_DM}=C_{C\_FIX1}+(2\cdot D1-1)\cdot C_{C\_1A}+(2\cdot D2-1)\cdot C_{C\_2A}+\ldots+(2\cdot DN-1)\cdot C_{C\_NA}.$$

Figure 5B:
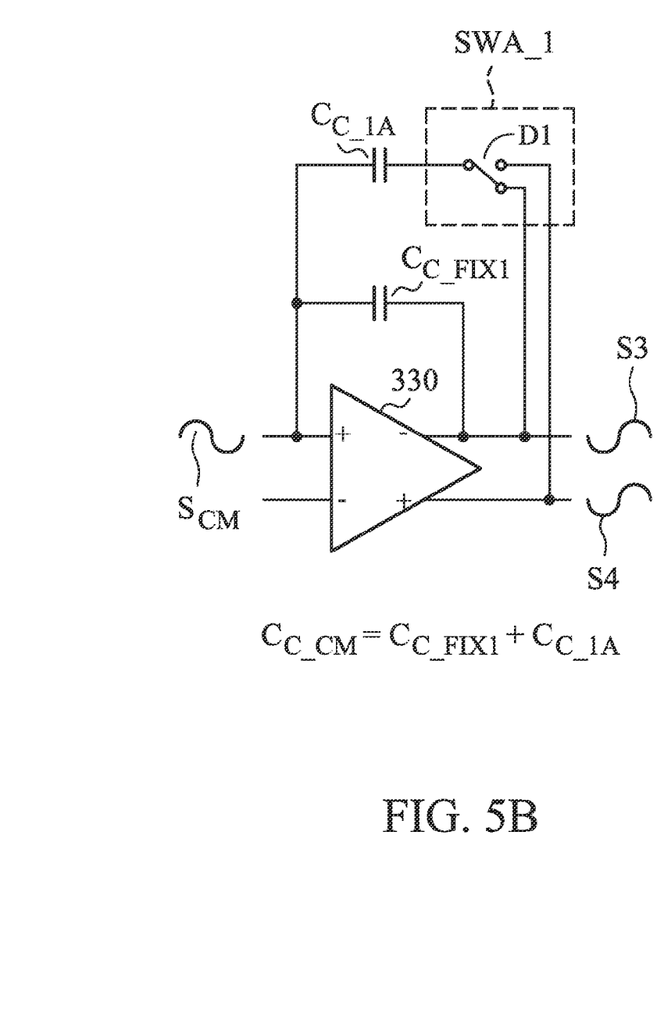
FIG. 5B shows an analysis schematic illustrating a common mode (CM) for the output amplifying stage of FIG. 3.

FIG. 5B shows an analysis schematic illustrating a common mode (CM) for the output amplifying stage 330 of FIG. 3. In order to simplify the description, only the selector SWA_1 and the capacitor $C_{C\_1A}$ are described for the compensation unit 350A. In response to a common mode signal $S_{CM}$ at the non-inverting input terminal of the amplifying stage 330, the amplifying stage 330 provides a signal S3 at the inverting output terminal thereof when the control signal D1 is "1", wherein the signal S3 and the common-mode signal $S_{CM}$ have the opposite phases. Thus, an effective common mode capacitance $C_{C\_CM}$ is obtained for the compensation unit 350A and the capacitor $C_{C\_FIX1}$, and the capacitor $C_{C\_CM}$ is equal to the sum of the capacitors $C_{C\_FIX1}$ and $C_{C\_1A}$, i.e. $C_{C\_CM}=C_{C\_FIX1}+C_{C\_1A}$ (D1="1"). Furthermore, when the control signal D1 is "0", the amplifying stage 330 provides a signal S4 at the non-inverting output terminal thereof when the control signal D1 is "0", wherein the signal S4 and the common-mode signal $S_{CM}$ have the opposite phases. Thus, an effective common mode capacitance $C_{C\_CM}$ is obtained for the compensation unit 350A and the capacitor $C_{C\_FIX1}$, and the capacitor $C_{C\_CM}$ is also equal to the sum of the capacitors $C_{C\_FIX1}$ and $C_{C\_1A}$, i.e. $C_{C\_CM}=C_{C\_FIX1}+C_{C\_1A}$ (D1="0"). Therefore, the effective common mode capacitance $C_{C\_CM}$ is identical over different operation modes. Furthermore, for the N selectors SWA_1-SWA_N, an effective common mode capacitance $C_{C\_DM}$ is obtained for the compensation unit 350A and the capacitor $C_{C\_FIX1}$ according to the following equation:

$$C_{C\_CM}=C_{C\_FIX1}+C_{C\_1A}+C_{C\_2A}+\ldots+C_{C\_NA}.$$

Figure 6:
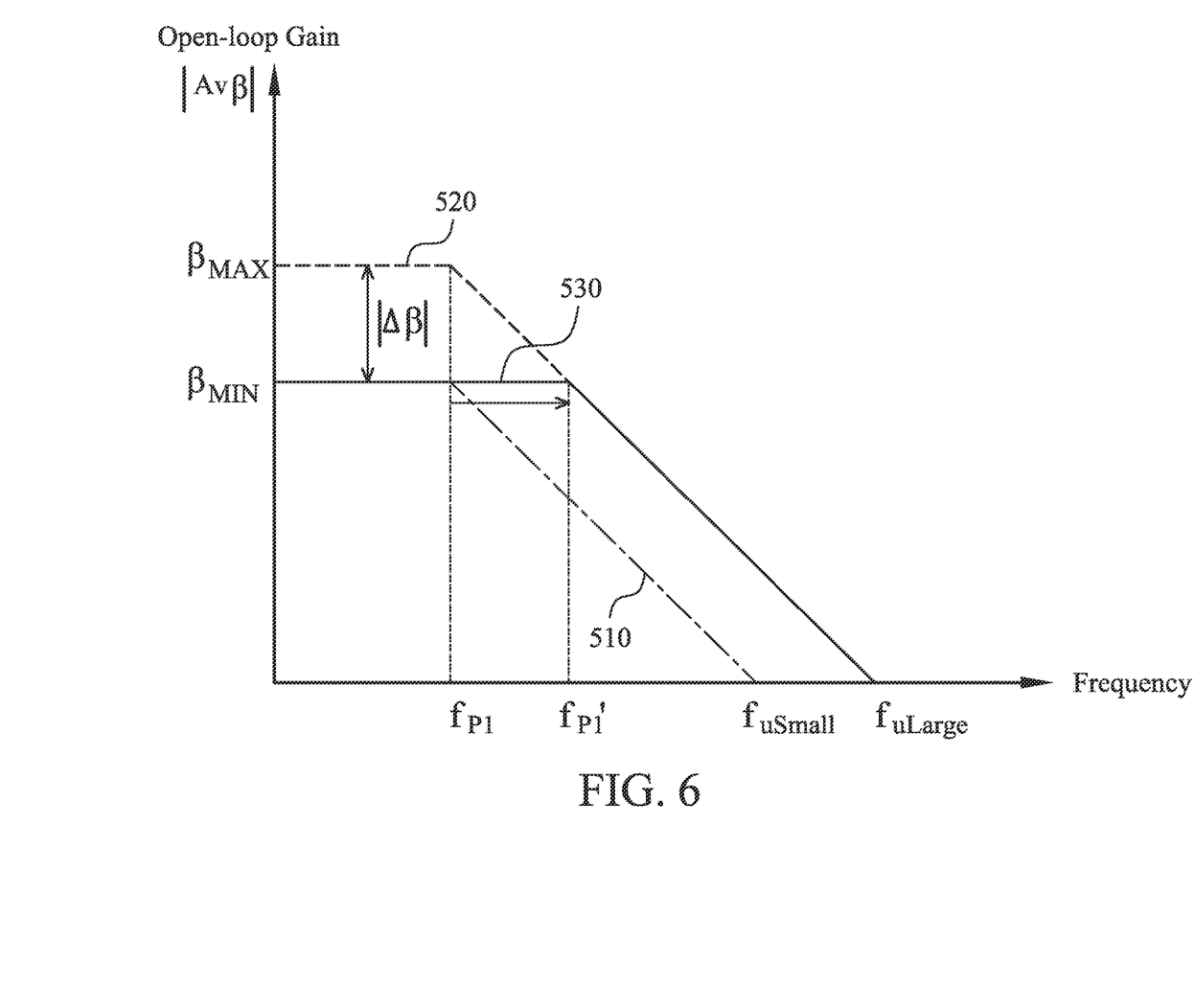
FIG. 6 shows a frequency response diagram illustrating the relationship between an open-loop gain $Av\beta$ and various operation modes.

FIG. 6 shows a frequency response diagram illustrating the relationship between an open-loop gain Avβ and various operation modes. Referring to FIG. 1, FIG. 2 and FIG. 6 together, the gain curve 510 represents the open-loop gain Avβ with a small feedback gain β for the multi-mode OPAMP-based circuit 200 of FIG. 2, i.e. the multi-mode OPAMP-based circuit 200 has a narrower loop bandwidth (e.g. a unity gain frequency $f_{uSmall}$), wherein the dominant pole frequency $f_{P1}$ is proportional to $1/C_{C1}$. A gain curve 520 represents the open-loop gain Avβ with a large feedback gain β for the multi-mode OPAMP-based circuit 200 of FIG. 2, i.e. the multi-mode OPAMP-based circuit 200 has a wider loop bandwidth (e.g. a unity gain frequency $f_{uLarge}$, and $f_{uSmall}<f_{uLarge}$), wherein the capacitances of the capacitor $C_{C1}$ and $C_{C2}$ of the two-stage operational amplifier 100 are limited by the large feedback gain β. Referring to FIG. 3 and FIG. 6 together, the gain curve 510 also represents an open-loop gain Avβ with a small feedback gain β for the multi-mode OPAMP-based circuit 300 of FIG. 3, and the dominant pole frequency $f_{P1}$ is proportional to $$\frac{1}{C_{C\_FIX1}+C_{C\_1A}}.$$

Furthermore, a gain curve 530 represents another open-loop gain Avβ with a small feedback gain β for the multi-mode OPAMP-based circuit 300 of FIG. 3, and the dominant pole frequency $f_{P1'}$ is proportional to $$\frac{1}{C_{C\_FIX1}-C_{C\_1A}} \quad (f_{P1}<f_{P1'}<f_{uSmall}).$$

As shown in FIG. 6, by using the compensation units 350A and 350B, the multi-mode OPAMP-based circuit 300 has a wider loop bandwidth with a small feedback gain β, i.e. the unity gain frequency of the gain curve 530 is close to the unity gain frequency $f_{uLarge}$ of maximum open-loop gain. In other words, the dominant pole frequency of the open-loop gain of the operational amplifier is increased (e.g. from $f_{P1}$ to $f_{P1'}$) when the open-loop gain of the operational amplifier is decreased (e.g. from $β_{MAX}$ to $β_{MIN}$). According to the embodiments, the differential mode open-loop bandwidth and stability can be delicately optimized under various operation modes without altering the common mode open-loop stability, thus improving a characteristic of a multi-mode OPAMP-based circuit in a close-loop.

Figure 7:
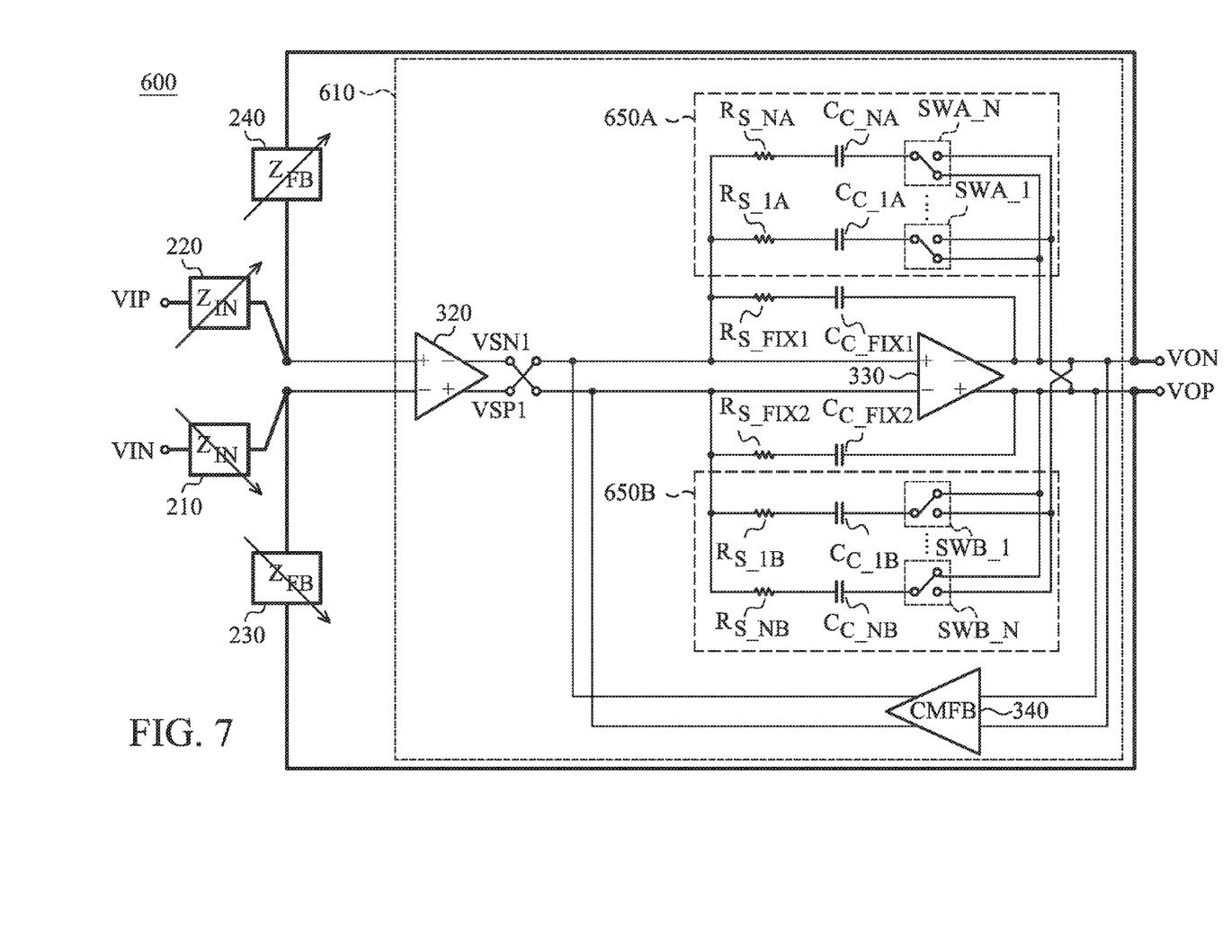
FIG. 7 shows a multi-mode OPAMP-based circuit according to another embodiment of the invention.

FIG. 7 shows a multi-mode OPAMP-based circuit 600 according to another embodiment of the invention. Compared with the multi-mode OPAMP-based circuit 300 of FIG. 3, a two-stage operational amplifier 610 further comprises the resistors $R_{S\_FIX1}$ and $R_{S\_FIX\,2}$ respectively coupled to the capacitors $C_{C\_FIX\,1}$ and $C_{C\_FIX\,2}$ in series. In the embodiment, the resistor $R_{S\_FIX1}$ is coupled between the capacitor $C_{C\_FIX1}$ and the non-inverting input terminal of the output amplifying stage 330, and the resistor $R_{S\_FIX2}$ is coupled between the capacitor $C_{C\_FIX2}$ and the inverting input terminal of the output amplifying stage 330. In another embodiment, the resistor $R_{S\_FIX1}$ is coupled between the capacitor $C_{C\_FIX1}$ and the inverting output terminal of the output amplifying stage 330, and the resistor $R_{S\_FIX2}$ is coupled between the capacitor $C_{C\_FIX2}$ and the non-inverting output terminal of the output amplifying stage 330. Furthermore, in FIG. 7, a compensation unit 650A further comprises a plurality of resistors $R_{S\_1A}$-$R_{S\_NA}$ respectively coupled to the capacitors $C_{C\_1A}$-$C_{C\_NA}$ in series, and a compensation unit 650B further comprises a plurality of resistors $R_{S\_1B}$-$R_{S\_NB}$ respectively coupled to the capacitors $C_{C\_1B}$-$C_{C\_NB}$ in series. Taking the resistor $R_{S\_1A}$ as an example, the resistor $R_{S\_1A}$ is coupled between the capacitor $C_{C\_1A}$ and the non-inverting input terminal of the output amplifying stage 330. In another embodiment, the resistor $R_{S\_1A}$ is coupled between the capacitor $C_{C\_1A}$ and the selector SWA_1. Furthermore, in another embodiment, if the selectors of the compensation units 650A and 650B are coupled to the input terminals of the output amplifying stage 330, as shown in FIG. 4, the resistor $R_{S\_1A}$ is coupled between the capacitor $C_{C\_1A}$ and the inverting output terminal of the output amplifying stage 330. Similarly, in another embodiment, the resistor $R_{S\_1A}$ is coupled between the capacitor $C_{C\_1A}$ and the selector SWA_1. Specifically, the series order of the resistors, capacitors and selectors can be swapped for the compensation units 650A and 650B.

Figure 8:
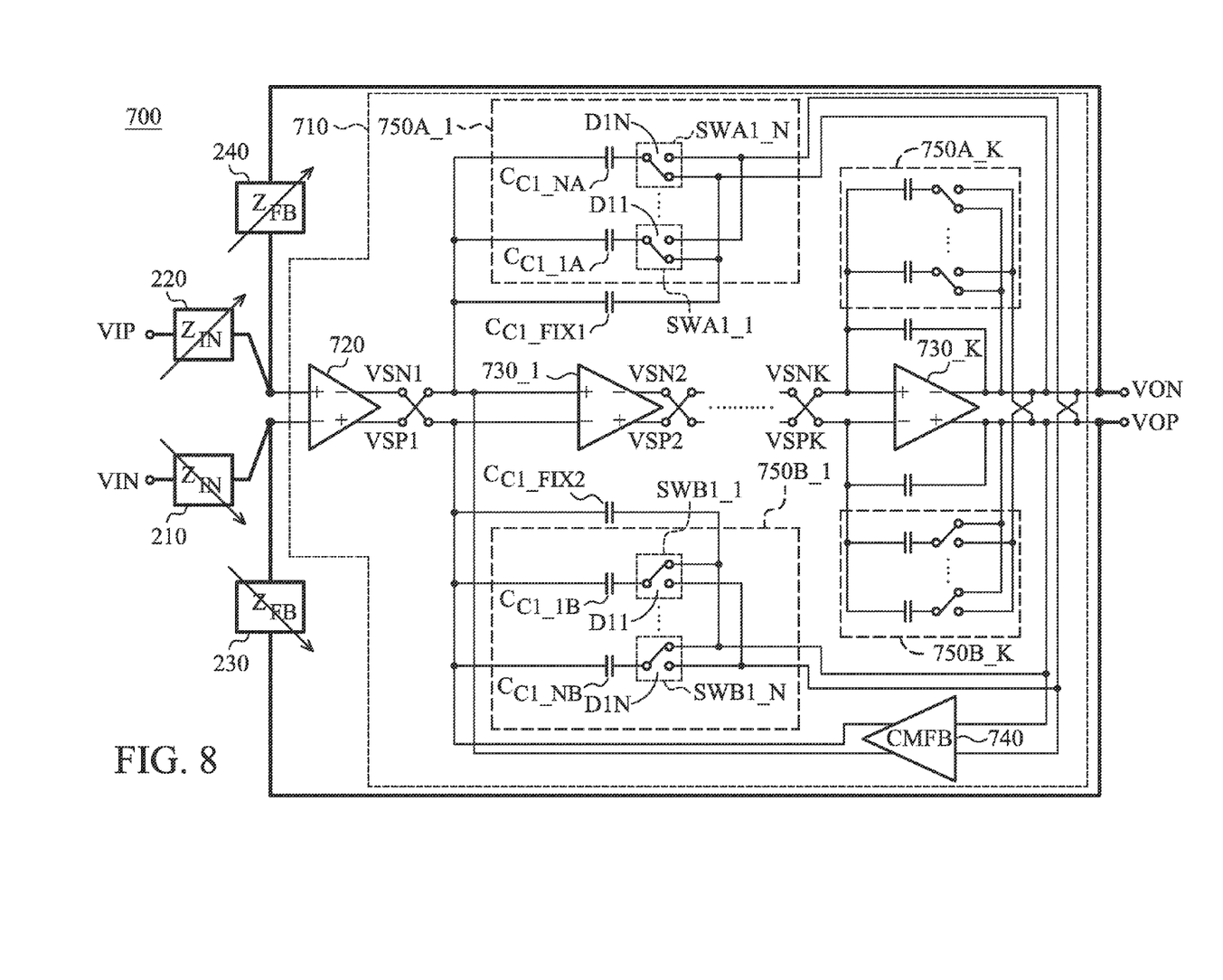
FIG. 8 shows a multi-mode OPAMP-based circuit according to another embodiment of the invention.

FIG. 8 shows a multi-mode OPAMP-based circuit 700 according to another embodiment of the invention. The multi-mode OPAMP-based circuit 700 comprises a multi-stage operational amplifier 710, and the impedances 210, 220, 230 and 240. The multi-stage operational amplifier 710 comprises an amplifying stage 720, a plurality of amplifying stages 730_1-730_K, and a common mode feedback stage 740. The amplifying stage 720 receives the pair of differential signals VIP and VIN via the input impedances 220 and 210 and amplifies the received signals, to provide a pair of differential signals VSP1 and VSN1 to the amplifying stage 730_1. The amplifying stage 730_1 amplifies the pair of differential signals VSP1 and VSN1 to output a pair of differential signals VSP2 and VSN2, and so on. Finally, the amplifying stage 730_K amplifies the pair of differential signals VSPK and VSNK to output the pair of output differential signals VOP and VON. The common mode feedback stage 740 is coupled to the serial of amplifying stages 730_1-730_K in parallel. Furthermore, each of the amplifying stages 730_1-730_K has the corresponding compensation units. For example, a compensation unit 750A_1 is coupled to the non-inverting input terminal of the amplifying stage 730_1, and the compensation unit 750B_1 is coupled to the inverting input terminal of the amplifying stage 730_1. The compensation unit 750A_1 comprises a plurality of capacitors $C_{C1\_1A}$-$C_{C1\_NA}$ and a plurality of selectors SWA1_1-SWA1_N, and the compensation unit 750B_1 comprises a plurality of capacitors $C_{C1\_1B}$-$C_{C1\_NB}$ and a plurality of selectors SWB1_1-SWB1_N. The selectors SWA1_1 and SWB1_1 are controlled by a control signal D11, the selectors SWA1_2 and SWB1_2 are controlled by a control signal D12, and so on. Specifically, for each of the amplifying stages 730_1-730_K, the corresponding compensation units are coupled between the input terminals thereof and the output terminals of the amplifying stage 730_K. In one embodiment, the corresponding compensation units can be replaced with the compensation capacitors $C_{C1}$ and $C_{C2}$ for some of the amplifying stages 730_1-730_K. As described above, the series order of the capacitors and selectors can be swapped for the compensation units 750A_1-750A_K and 750B_1-750B_K. Furthermore, some of the compensation units 750A_1-750A_K and 750B_1-750B_K can also be replaced by the feed-forward transconductance cells (Gm).

Figure 9:
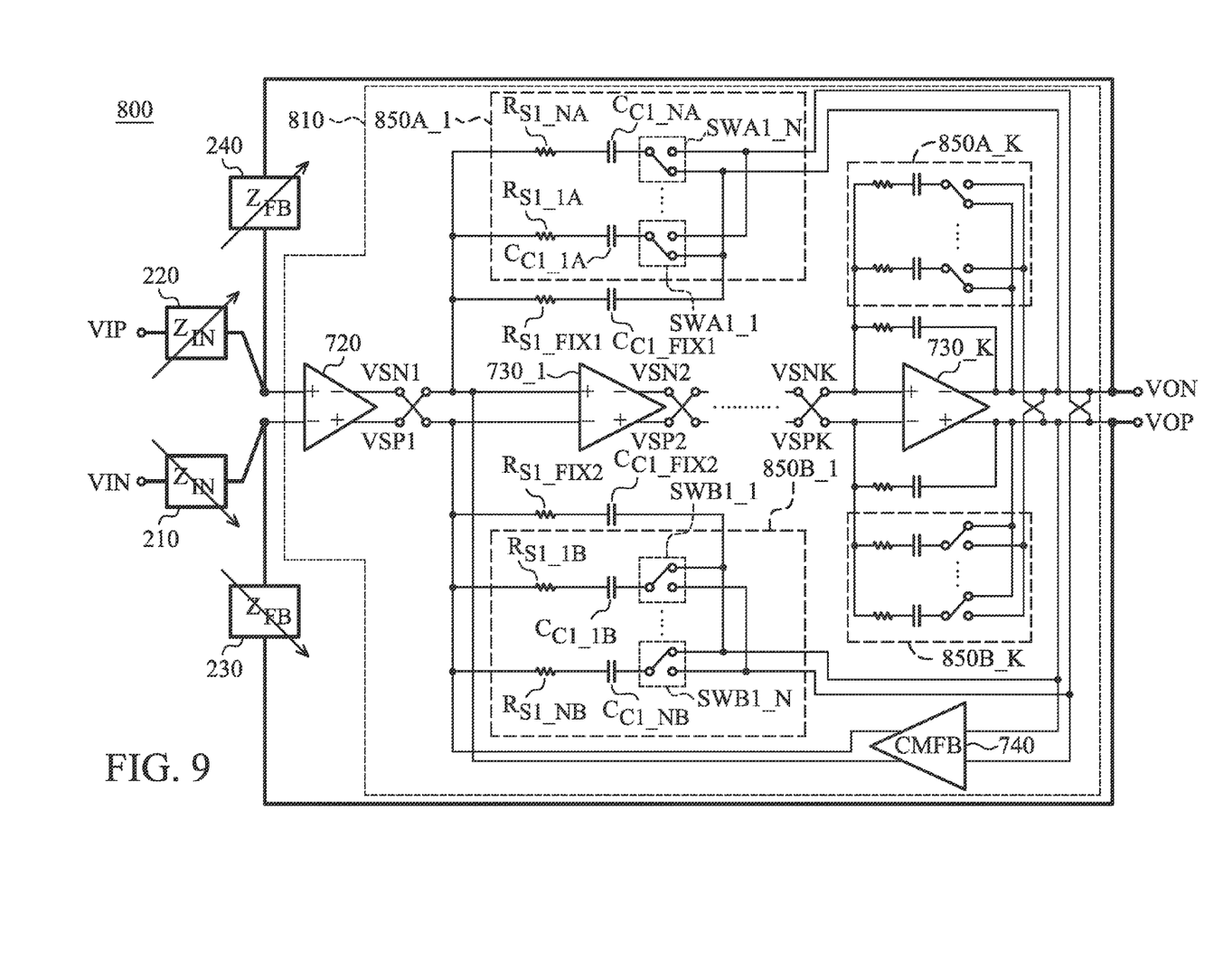
FIG. 9 shows a multi-mode OPAMP-based circuit according to another embodiment of the invention.

FIG. 9 shows a multi-mode OPAMP-based circuit 800 according to another embodiment of the invention. Compared with the operational amplifier 710 of FIG. 8, a plurality of resistors $R_{S1\_FIX1}$-$R_{SK\_FIX1}$ and $R_{S1\_FIX2}$-$R_{SK\_FIX2}$ are added in the operational amplifier 810, and the corresponding compensation units further comprises the resistors respectively coupled to the corresponding capacitors thereof in series. For example, the resistor $R_{S1\_FIX1}$ is coupled between the capacitor $C_{C1\_FIX1}$ and the non-inverting input terminal of the amplifying stage 730_1. Furthermore, in the compensation unit 850A_1, the resistors $R_{S1\_1A}$-$R_{S1\_NA}$ are respectively coupled to the corresponding capacitors $C_{C1\_1A}$-$C_{C1\_NA}$ in series. As described above, the series order of the resistors, capacitors and selectors can be swapped for the compensation units 850A_1-850A_K and 850B_1-850B_K.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-mode OPAMP-based circuit, comprising:
   an operational amplifier, comprising:
   an input amplifying stage, amplifying a pair of input differential signals to provide a pair of intermediate differential signals;
   an output amplifying stage, amplifying the pair of intermediate differential signals to provide a pair of output differential signals; and
   a compensation unit, comprising:
   a first capacitor disposed in a first negative feedback loop of the output amplifying stage;
   a second capacitor disposed in a second negative feedback loop of the output amplifying stage;
   a third capacitor selectively disposed in a first positive feedback loop of the output amplifying stage or the first negative feedback loop of the output amplifying stage according to a control signal; and
   a fourth capacitor selectively disposed in a second positive feedback loop of the output amplifying stage or the second negative feedback loop of the output amplifying stage according to the control signal,
   wherein when the third capacitor is disposed in the first positive feedback loop of the output amplifying stage, the fourth capacitor is disposed in the second positive feedback loop of the output amplifying stage,
   wherein when the third capacitor is disposed in the first negative feedback loop of the output amplifying stage, the fourth capacitor is disposed in the second negative feedback loop of the output amplifying stage.

2. The multi-mode OPAMP-based circuit as claimed in claim 1, wherein the capacitances of the first and second capacitors are identical, and the capacitances of the third and fourth capacitors are identical.

3. The multi-mode OPAMP-based circuit as claimed in claim 1, wherein the first negative feedback loop is formed between an inverting output terminal and a non-inverting input terminal of the output amplifying stage, and the second negative feedback loop is formed between a non-inverting output terminal and an inverting input terminal of the output amplifying stage.

4. The multi-mode OPAMP-based circuit as claimed in claim 3, wherein the compensation unit further comprises:
   a first selector, selectively coupling the third capacitor to the inverting or non-inverting output terminal of the output amplifying stage according to the control signal; and
   a second selector, selectively coupling the fourth capacitor to the non-inverting output terminal or inverting output terminal of the output amplifying stage according to the control signal,
   wherein the first positive feedback loop is formed between the non-inverting output terminal and the non-inverting input terminal of the output amplifying stage, and the second positive feedback loop is formed between the inverting output terminal and the inverting input terminal of the output amplifying stage.

5. The multi-mode OPAMP-based circuit as claimed in claim 3, wherein the compensation unit further comprises:
   a first selector, selectively coupling the third capacitor to the non-inverting or inverting input terminal of the output amplifying stage according to the control signal; and a second selector, selectively coupling the fourth capacitor to the inverting or non-inverting input terminal of the output amplifying stage according to the control signal;

wherein the first positive feedback loop is formed between the inverting output terminal and the inverting input terminal of the output amplifying stage, and the second positive feedback loop is formed between the non-inverting output terminal and the non-inverting input terminal of the output amplifying stage.

6. The multi-mode OPAMP-based circuit as claimed in claim 1, further comprising:
a first impedance coupled to a non-inverting input terminal of the input amplifying stage, receiving one of the input differential signals;
a second impedance coupled to an inverting input terminal of the input amplifying stage, receiving another of the input differential signals;
a third impedance coupled between the non-inverting input terminal of the input amplifying stage and an inverting output terminal of the output amplifying stage; and
a fourth impedance coupled between the inverting input terminal of the input amplifying stage and a non-inverting output terminal of the output amplifying stage,
wherein the impedances of the first and second impedances are identical and variable, and the impedances of the third and fourth impedances are identical and variable.

7. The multi-mode OPAMP-based circuit as claimed in claim 1, wherein the control signal controls the third capacitor to couple to the first capacitor in parallel when the control signal controls the fourth capacitor to couple to the second capacitor in parallel, and the control signal controls the third capacitor disposed in the first positive feedback loop when the control signal controls the fourth capacitor disposed in the second positive feedback loop, so that a dominant pole frequency of a open-loop gain of the operational amplifier is increased when the open-loop gain of the operational amplifier is decreased.

8. The multi-mode OPAMP-based circuit as claimed in claim 1, wherein the compensation unit further comprises:
a first resistor connected with the first capacitor in series;
a second resistor connected with the second capacitor in series;
a third resistor connected with the third capacitor in series; and
a fourth resistor connected with the fourth capacitor in series.

9. A multi-mode OPAMP-based circuit, comprising:
an operational amplifier, comprising:
an input amplifying stage, amplifying a pair of input differential signals to provide a pair of intermediate differential signals;
an output amplifying stage, amplifying the pair of intermediate differential signals to provide a pair of output differential signals; and
a compensation unit, comprising:
a first programmable capacitor unit coupled to a non-inverting input terminal of the output amplifying stage; and
a second programmable capacitor unit coupled to an inverting input terminal of the output amplifying stage,
wherein each of the first and second programmable capacitor units provides a fixed capacitance in a common mode for the operational amplifier, and each of the first and second programmable capacitor units provides adjustable capacitance in a differential-mode according to a control signal for the operational amplifier, wherein when each of the first and second programmable capacitor units is further coupled to both a non-inverting output terminal and an inverting output terminal of the output amplifying stage, each of the first and second programmable capacitor units provides a first capacitance,
wherein when the first programmable capacitor unit is further coupled to only the inverting output terminal of the output amplifying stage and the second programmable capacitor unit is further coupled to only the non-inverting output terminal of the output amplifying stage, each of the first and second programmable capacitor units provides a second capacitance smaller than the first capacitance.

10. The multi-mode OPAMP-based circuit as claimed in claim 9, wherein the first programmable capacitor unit comprises:
a first capacitor coupled between the non-inverting input terminal and the inverting output terminal of the output amplifying stage, having the first capacitance; and
a second capacitor selectively coupled between the non-inverting input terminal and the inverting output terminal of the output amplifying stage or between the non-inverting input terminal and the non-inverting output terminal of the output amplifying stage according to the control signal, having the second capacitance,
wherein the second programmable capacitor unit comprises:
a third capacitor coupled between the inverting input terminal and the non-inverting output terminal of the output amplifying stage, having the first capacitance; and
a fourth capacitor selectively coupled between the inverting input terminal and the non-inverting output terminal of the output amplifying stage or between the inverting input terminal and the inverting output terminal of the output amplifying stage according to the control signal, having the second capacitance.

11. The multi-mode OPAMP-based circuit as claimed in claim 10, wherein the fixed capacitance is equal to the sum of the first and second capacitances, and wherein the adjustable capacitance is equal to the sum of the first and second capacitances when the second capacitor is coupled between the non-inverting input terminal and the inverting output terminal of the output amplifying stage and the fourth capacitor is coupled between the inverting input terminal and the non-inverting output terminal of the output amplifying stage, and the adjustable capacitance is equal to the difference between the first and second capacitances when the second capacitor is coupled between the non-inverting input terminal and the non-inverting output terminal of the output amplifying stage and the fourth capacitor is coupled between the inverting input terminal and the inverting output terminal of the output amplifying stage.

12. The multi-mode OPAMP-based circuit as claimed in claim 10, wherein the compensation unit further comprises:
a first resistor connected with the first capacitor in series;
a second resistor connected with the second capacitor in series;
a third resistor connected with the third capacitor in series; and
a fourth resistor connected with the fourth capacitor in series.

13. The multi-mode OPAMP-based circuit as claimed in claim 9, wherein the first programmable capacitor unit comprises:
a first capacitor coupled between the non-inverting input terminal and the inverting output terminal of the output amplifying stage, having the first capacitance; and
a second capacitor selectively coupled between the non-inverting input terminal and the inverting output terminal of the output amplifying stage or between an inverting input terminal and the inverting output terminal of the output amplifying stage according to the control signal, having the second capacitance,
wherein the second programmable capacitor unit comprises:
a third capacitor coupled between the inverting input terminal and the non-inverting output terminal of the output amplifying stage, having the first capacitance; and
a fourth capacitor selectively coupled between the inverting input terminal and the non-inverting output terminal of the output amplifying stage or between the non-inverting input terminal and the non-inverting output terminal of the output amplifying stage according to the control signal, having the second capacitance.

14. The multi-mode OPAMP-based circuit as claimed in claim 13, wherein the fixed capacitance is equal to the sum of the first and second capacitances, and wherein the adjustable capacitance is equal to the sum of the first and second capacitances when the second capacitor is coupled between the non-inverting input terminal and the inverting output terminal of the output amplifying stage and the fourth capacitor is coupled between the inverting input terminal and the non-inverting output terminal of the output amplifying stage, and the adjustable capacitance is equal to the difference between the first and second capacitances when the second capacitor is coupled between the inverting input terminal and the inverting output terminal of the output amplifying stage and the fourth capacitor is coupled between the non-inverting input terminal and the non-inverting output terminal of the output amplifying stage.

15. The multi-mode OPAMP-based circuit as claimed in claim 13, wherein the compensation unit further comprises:
a first resistor connected with the first capacitor in series;
a second resistor connected with the second capacitor in series;
a third resistor connected with the third capacitor in series; and
a fourth resistor connected with the fourth capacitor in series.

16. The multi-mode OPAMP-based circuit as claimed in claim 9, further comprising:
a first impedance coupled to a non-inverting input terminal of the input amplifying stage, receiving one of the input differential signals;
a second impedance coupled to an inverting input terminal of the input amplifying stage, receiving another of the input differential signals;
a third impedance coupled between the non-inverting input terminal of the input amplifying stage and an inverting output terminal of the output amplifying stage; and
a fourth impedance coupled between the inverting input terminal of the input amplifying stage and the non-inverting output terminal of the output amplifying stage,
wherein the impedances of the first and second impedances are identical and variable, and the impedances of the third and fourth impedances are identical and variable.

17. A multi-mode OPAMP-based circuit, comprising: an operational amplifier, comprising:
an input amplifying stage, amplifying a pair of input differential signals to provide a pair of intermediate differential signals;
an output amplifying stage, amplifying the pair of intermediate differential signals to provide a pair of output differential signals; and
a compensation unit, comprising:
a first programmable capacitor unit coupled to a non-inverting input terminal of the output amplifying stage; and
a second programmable capacitor unit coupled to an inverting input terminal of the output amplifying stage,
wherein each of the first and second programmable capacitor units provides adjustable capacitance in a differential-mode according to a control signal for the operational amplifier, so that a dominant pole frequency of a open-loop gain of the operational amplifier is increased when the open-loop gain of the operational amplifier is decreased,
wherein when each of the first and second programmable capacitor units is further coupled to both a non-inverting output terminal and an inverting output terminal of the output amplifying stage, each of the first and second programmable capacitor units provides a first capacitance,
wherein when the first programmable capacitor unit is further coupled to only the inverting output terminal of the output amplifying stage and the second programmable capacitor unit is further coupled to only the non-inverting output terminal of the output amplifying stage, each of the first and second programmable capacitor units provides a second capacitance smaller than the first capacitance.

18. The multi-mode OPAMP-based circuit as claimed in claim 17, wherein the first programmable capacitor unit comprises:
a first capacitor coupled between the non-inverting input terminal and the inverting output terminal of the output amplifying stage, having the first capacitance; and
a second capacitor selectively coupled between the non-inverting input terminal and the inverting output terminal of the output amplifying stage or between the non-inverting input terminal and the non-inverting output terminal of the output amplifying stage according to the control signal, having the second capacitance,
wherein the second programmable capacitor unit comprises:
a third capacitor coupled between the inverting input terminal and the non-inverting output terminal of the output amplifying stage, having the first capacitance; and
a fourth capacitor coupled between the inverting input terminal and the non-inverting output terminal of the output amplifying stage or between the inverting input terminal and the inverting output terminal of the output amplifying stage according to the control signal, having the second capacitance.

19. The multi-mode OPAMP-based circuit as claimed in claim 18, wherein each of the first and second programmable capacitor units provides a fixed capacitance equal to the sum of the first and second capacitances in a common mode for the operational amplifier, and the adjustable capacitance is equal to the difference between the first and second capacitances when the second capacitor is coupled between the non-inverting input terminal and the non-inverting output terminal of the output amplifying stage and the fourth capacitor is coupled between the inverting input terminal and the inverting output terminal of the output amplifying stage, so that a unity gain frequency of the open-loop gain of the operational amplifier is close to a unity gain frequency of a maximum open-loop gain of the operational amplifier.

20. The multi-mode OPAMP-based circuit as claimed in claim 18, wherein the compensation unit further comprises:
   a first resistor connected with the first capacitor in series;
   a second resistor connected with the second capacitor in series;
   a third resistor connected with the third capacitor in series; and
   a fourth resistor connected with the fourth capacitor in series.

21. The multi-mode OPAMP-based circuit as claimed in claim 17, wherein the first programmable capacitor unit comprises:
   a first capacitor coupled between the non-inverting input terminal and the inverting output terminal of the output amplifying stage, having the first capacitance; and
   a second capacitor selectively coupled between the non-inverting input terminal and the inverting output terminal of the output amplifying stage or between an inverting input terminal and the inverting output terminal of the output amplifying stage according to the control signal, having the second capacitance,
   wherein the second programmable capacitor unit comprises:
      a third capacitor coupled between the inverting input terminal and the non-inverting output terminal of the output amplifying stage, having the first capacitance; and
      a fourth capacitor selectively coupled between the inverting input terminal and the non-inverting output terminal of the output amplifying stage or between the non-inverting input terminal and the non-inverting output terminal of the output amplifying stage according to the control signal, having the second capacitance.

22. The multi-mode OPAMP-based circuit as claimed in claim 21, wherein each of the first and second programmable capacitor units provides a fixed capacitance equal to the sum of the first and second capacitances in a common mode for the operational amplifier, and the adjustable capacitance is equal to the difference between the first and second capacitances when the second capacitor is coupled between the inverting input terminal and the inverting output terminal of the output amplifying stage and the fourth capacitor is coupled between the non-inverting input terminal and the non-inverting output terminal of the output amplifying stage, so that a unity gain frequency of the open-loop gain of the operational amplifier is close to a unity gain frequency of a maximum open-loop gain of the operational amplifier.

23. The multi-mode OPAMP-based circuit as claimed in claim 22, wherein the compensation unit further comprises:
   a first resistor connected with the first capacitor in series;
   a second resistor connected with the second capacitor in series;
   a third resistor connected with the third capacitor in series; and
   a fourth resistor connected with the fourth capacitor in series.

24. The multi-mode OPAMP-based circuit as claimed in claim 17, further comprising:
   a first impedance coupled to a non-inverting input terminal of the input amplifying stage, receiving one of the input differential signals;
   a second impedance coupled to an inverting input terminal of the input amplifying stage, receiving another of the input differential signals;
   a third impedance coupled between the non-inverting input terminal of the input amplifying stage and the inverting output terminal of the output amplifying stage; and
   a fourth impedance coupled between the inverting input terminal of the input amplifying stage and the non-inverting output terminal of the output amplifying stage,
   wherein the impedances of the first and second impedances are identical and variable, and the impedances of the third and fourth impedances are identical and variable.

* * * * *